United States Patent [19]

Kabadi

[11] Patent Number: 4,850,883
[45] Date of Patent: Jul. 25, 1989

[54] HIGH DENSITY FLEXIBLE CIRCUIT CONNECTOR

[75] Inventor: Ashok N. Kabadi, Beaverton, Oreg.

[73] Assignee: Intel Corporation, Santa Clara, Calif.

[21] Appl. No.: 53,270

[22] Filed: May 21, 1987

[51] Int. Cl.⁴ .................. H01R 9/09; H01R 13/62; H01R 9/07

[52] U.S. Cl. .................. 439/67; 439/65; 439/91; 439/329; 439/493; 439/591

[58] Field of Search .................. 439/65–67, 439/74, 77, 91, 329, 493, 591

[56] References Cited

U.S. PATENT DOCUMENTS

| | | | |
|---|---|---|---|
| 4,125,310 | 11/1978 | Reardon, II et al. | 439/329 |
| 4,194,800 | 3/1980 | Chow | 439/67 |
| 4,357,061 | 11/1982 | Crosby | 439/66 |
| 4,437,718 | 3/1984 | Selinko | 439/591 |
| 4,445,735 | 5/1984 | Bonnefoy | 439/592 |
| 4,466,184 | 8/1984 | Cuneo et al. | 439/83 |
| 4,509,099 | 4/1985 | Takamatsu et al. | 439/65 |
| 4,593,961 | 6/1986 | Cosmo | 439/591 |
| 4,695,258 | 9/1987 | Hanson et al. | 439/329 |
| 4,768,971 | 9/1988 | Simpson | 439/67 |
| 4,798,541 | 1/1989 | Porter | 439/67 |

OTHER PUBLICATIONS

Buchoff, "Metal–Elastomer Display Connectors", 05/1979, pp. 64–65.

*Primary Examiner*—P. Austin Bradley
*Attorney, Agent, or Firm*—Blakely, Sokoloff, Taylor & Zafman

[57] ABSTRACT

A clamping system for use in connecting high density flexible circuit to a rigid printed circuit board. The clamping system utilizes metal-on-elastomer (MOE) strips contained in a MOE holder and held in place by clamping components to provide electrical connections between the high density flexible circuit and the rigid printed circuit board. The clamping system utilizes a flexible mouth surrounding the high density flexible circuit to alleviate stress on the high density flexible circuit, a special plating on the conductors of the high density flexible circuit to prevent oxidation, and a stiffener clamp to provide stability for the MOE strips.

21 Claims, 4 Drawing Sheets

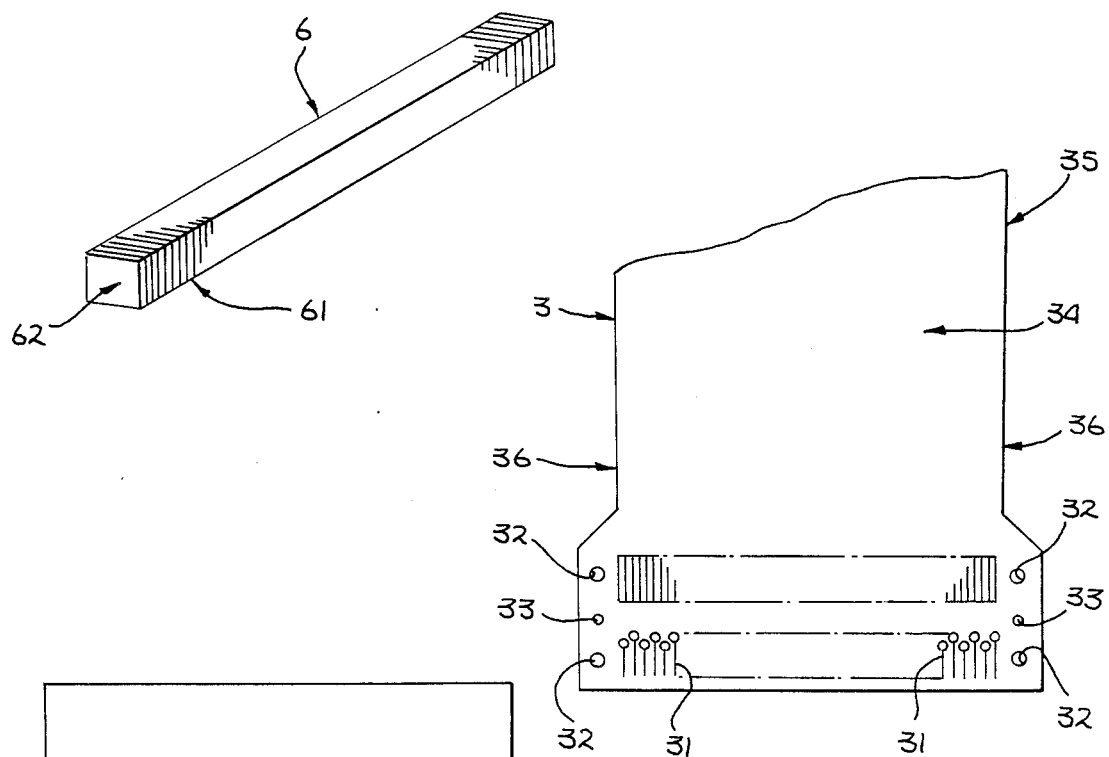
Fig. 2 (PRIOR ART)
Fig. 3
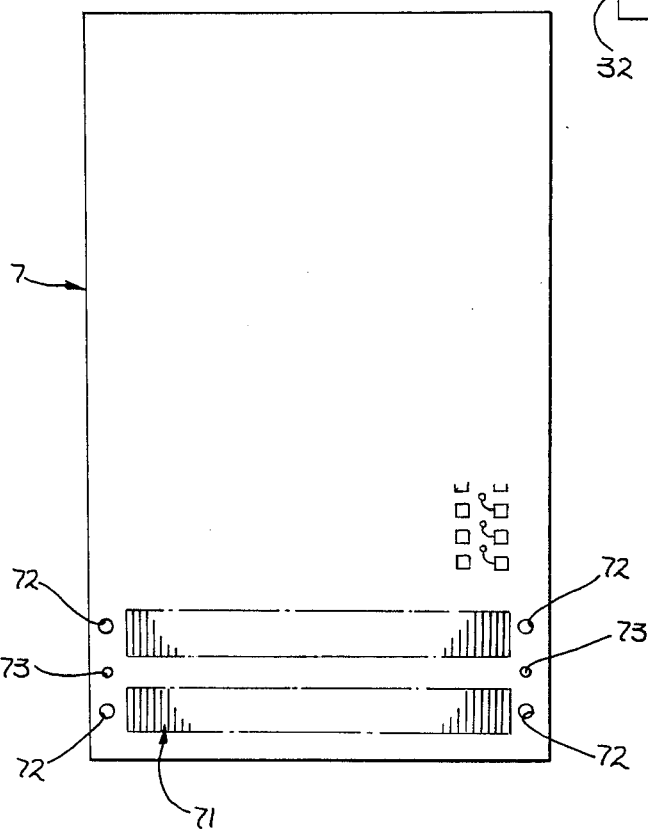
Fig. 4

4,850,883

HIGH DENSITY FLEXIBLE CIRCUIT CONNECTOR

BACKGROUND OF THE INVENTION

1. Field of the Invention

This invention relates to the field of electrical connectors and particularly to electrical connectors for connecting flexible circuit to rigid printed circuit (PC) boards.

2. Prior Art

Prior methods of connecting flexible circuits to rigid PC boards consist primarily of pin and socket connectors whereby a line on the flexible circuit would terminate into a pin which is part of a connector assembly. Each line of the flexible circuit terminates into a separate pin in the connector. The lines on the rigid PC board terminate into sockets capable of connecting with the pins. The sockets are part of a connector assembly capable of mating with the pin connector assembly. Alternatively the rigid PC board lines could be connected to the pins and the flexible circuit lines could be connected to the sockets. The pin and socket method requires the pins and sockets to be mounted on 0.100 inch centers which results in the disadvantage of not allowing high density interconnect. In addition, the connector is bulky and can be difficult to assemble.

Prior art methods of connecting ribbon cable to rigid circuit boards or other electrical devices include use of connectors. However, such connectors are incapable of connecting the high density flexible circuits which may be connected with the present invention. Ribbon cable is also of a much lower density than the high density flexible circuit of the present invention.

The present invention utilizes a metal-on-elastomer (MOE) strip which provides the electrical connection between the flexible circuit and the rigid PC board. MOE strips have been used in the past to provide electrical connections, however, these uses have been limited to interconnecting two or more rigid PC boards, or for terminating high-empedance circuits such as those on liquid crystal displays. Previous use of MOE strips to connect flexible circuits to rigid PC boards was not possible because previous designs of clamping systems lead to cracking and breaking of the flexible circuit.

SUMMARY OF THE INVENTION

An improved electrical connector is described for use in connecting flexible circuit to rigid PC boards. The invention consists of a high density flexible circuit which is connected to a rigid printed circuit (PC) board through a clamping system. The clamping system consists of metal-on-elastomer (MOE) strips held in place by an MOE holder clamped between the rigid PC board and the high density flexible circuit. A MOE clamp is placed on the opposite side of the high density flexible circuit to provide rigidity for the flexible circuit and compression for the MOE strip. A stiffener is attached to the opposite side of the rigid PC board to provide additional compression and rigidity.

The invention discloses several important features including means to alleviate high stress areas of the flexible circuit, means providing for stable electrical resistance over time and over a variety of temperature and humidity conditions, means for providing a lower profile, less bulky housing than prior art methods and a special plating process to reduce oxidation and corrosion of the electrical conductors on the flexible circuit and the rigid PC board.

BRIEF DESCRIPTION OF THE DRAWINGS

FIG. 2 is a perspective view of a metal-on-elastomer (MOE) strip contained in the clamp assembly.

FIG. 3 is a perspective view of a flexible circuit connected by the clamp assembly.

FIG. 4 is a perspective view of a rigid printed circuit board which is electrically connected through the clamp assembly to the flexible circuit.

FIG. 5($b$) is a side planar view of a MOE holder used to hold the MOE strip.

DETAILED DESCRIPTION OF THE PRESENT INVENTION

A connecting system for connecting high density flexible circuit to rigid printed circuit (PC) boards disclosed. In the following description, numerous specific details are set forth to provide a thorough understanding of the present invention. It will be obvious to one skilled in the art that the invention may be employed without these specific details. In other instances, well-known methods and structures have not been set forth in order not to unnecessarily obscure the present invention.

Figure 1:
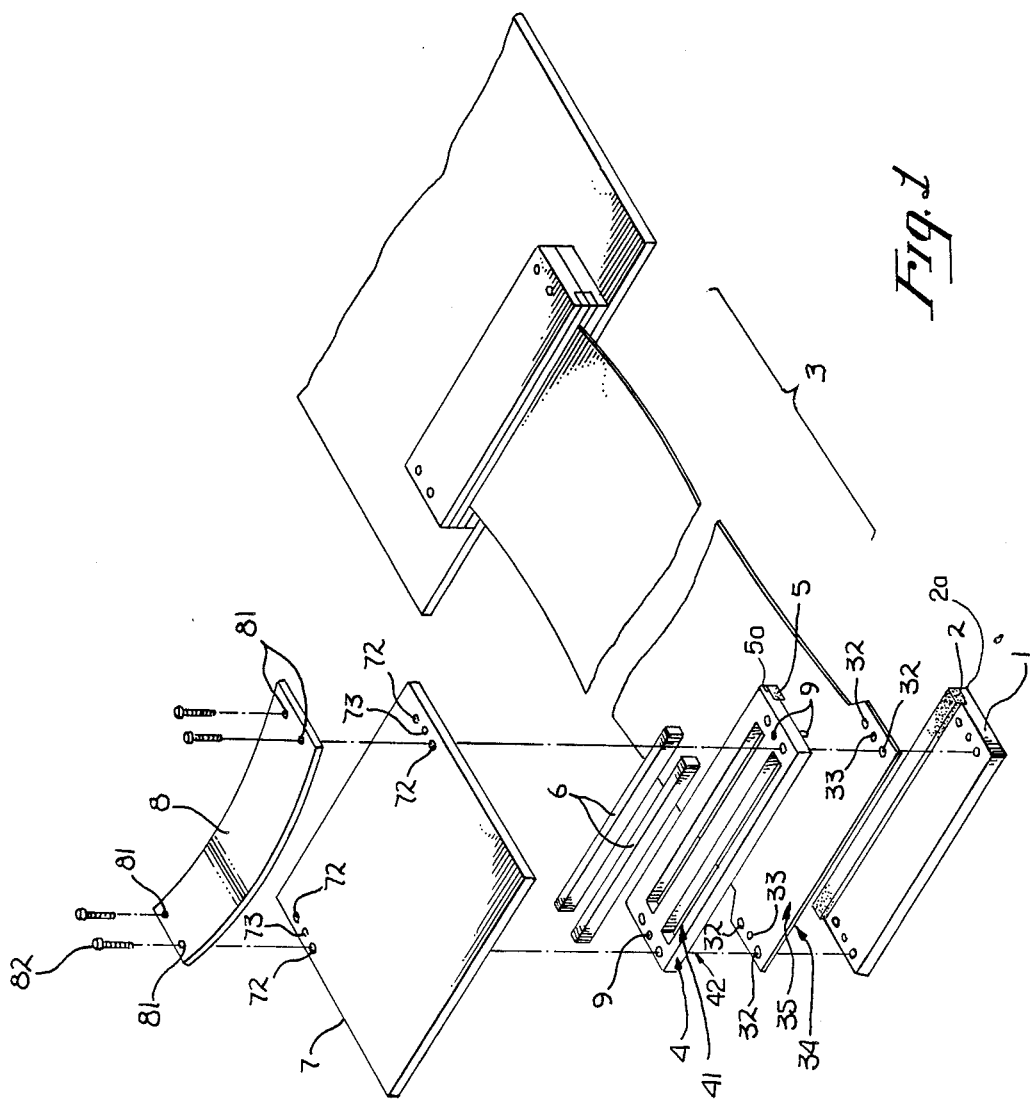
FIG. 1 is a perspective view of a clamp assembly as disclosed in the present invention.

Referring to FIG. 1, the preferred embodiment of a clamping system of the present invention is illustrated. A high density flexible circuit 3 is connected to a rigid PC board 7 through the clamping system. Metal-on-elastomer (MOE) strips 6 are inserted into the MOE holder 4. One side 41 of the MOE holder is then placed against the rigid PC board 7 and the one side 35 of the high density flexible circuit 3 is placed against the opposite side 42 of the MOE holder. Alignment is provided by the posts 9 on the sides of the MOE holder and corresponding holes 73 in the rigid PC board 7 and holes 33 in flexible circuit 3. A MOE clamp 1 is then placed on the opposite side 34 of the flexible circuit and aligned with the posts 9. Finally, a stiffener 8 is placed on the back of the rigid PC board 7 and its screw holes 81 aligned with the corresponding holes 72 on the rigid PC board. The stiffener 8 is then fastened to the rest of the clamping system with screws 82. The screws 82 go through the stiffener 8, the rigid PC board 7, the MOE holder 4 and the flexible circuit 3 and are fastened into the MOE clamp 1.

It will be obvious to one skilled in the art that an alternative embodiment would allow the posts to be attached to a different component of the assembly or additional posts and alignment holes may be added to ease the alignment process. In addition, an alternative embodiment may use a different fastening means than the screws illustrated.

Referring now to FIG. 2, the MOE strip 6 in the preferred embodiment consists of a length of compressible silicone rubber 62 that has small conductive copper strips 61 plated with nickel and gold attached to the outside of it. The MOE strip in the preferred embodiment has rectangular dimensions of 0.079±0.004 inches wide by 0.138±0.004 inches high and is 1.800±0.010 inches long. The strip will withstand temperature conditions of 25° C. to 55° C. and a relative humidity of 50% to 95% with thermal shock temperature extremes of −40° C. to +70° C. for 45 minutes at either extreme without any evidence of mechanical or electrical degradation. The MOE strip 6 has a compression of 10 to 15% with a compression set maximum of 25% when compressed and has a hardness of approximately 62 shore A to aid in minimizing compression set. The MOE strip 6 has electrical capacitance of 0.1 pF between adjacent conductors, connection resistance of 25 milliohms maximum at 20 millivolt DC and 50 milliampere maximum current, a carrying capacity per single conductor of 100 milliamps, insulation resistance of $10^{11}$ ohms minimum and a voltage rating between conductors of 50 volts. The copper strips 61 in the preferred embodiment are plated with finish of 10 micro-inches of gold over 50 micro-inches of nickel. The copper strips 61 are embedded in polyurethane foil appoximately 0.008 inches thick and wound around the silicone core 62. The MOE strip 6 of the preferred embodiment is commercially available from vendors such as AMP of Harrisburg, PA as part number 164815-3. It will be obvious to one skilled in the art that alternatives from the specification for the preferred embodiment may be found. In addition, the specification presented for the preferred embodiment is not meant to be limiting, but is presented as an example of one embodiment of the present invention.

Referring now to FIG. 3, the high density flexible circuit 3 is illustrated. The connection pads 31 of the high density flexible circuit 3 are electrically coupled to connection pads 71 of the rigid PC board FIG. 4, through contact with the MOE strip. Holes for the screw fasteners 32 and the holes for the alignment posts 33 are provided on both outer edges 36 of the flexible circuit. The cable of the preferred embodiment consists of a 0.003 inch Kapton TM strip with 0.0014 inch thick copper traces placed on either side and with 0.001 inch of Teflon TM coating on either side (34 and 35). Copper tear stops 0.040 inches wide are placed between the Kapton TM strip and Teflon TM coating on both sides (34 and 35) of the strip at each outer edge 36. Both ends of the cable have a strain relief consisting of a layer of 0.002 inch thick Kapton TM material over the Teflon TM coating. The cable of the preferred embodiment is 19 inches long by 1.75 inches wide at the center and 2.225 inches at the connector strain reliefs.

Figure 8:
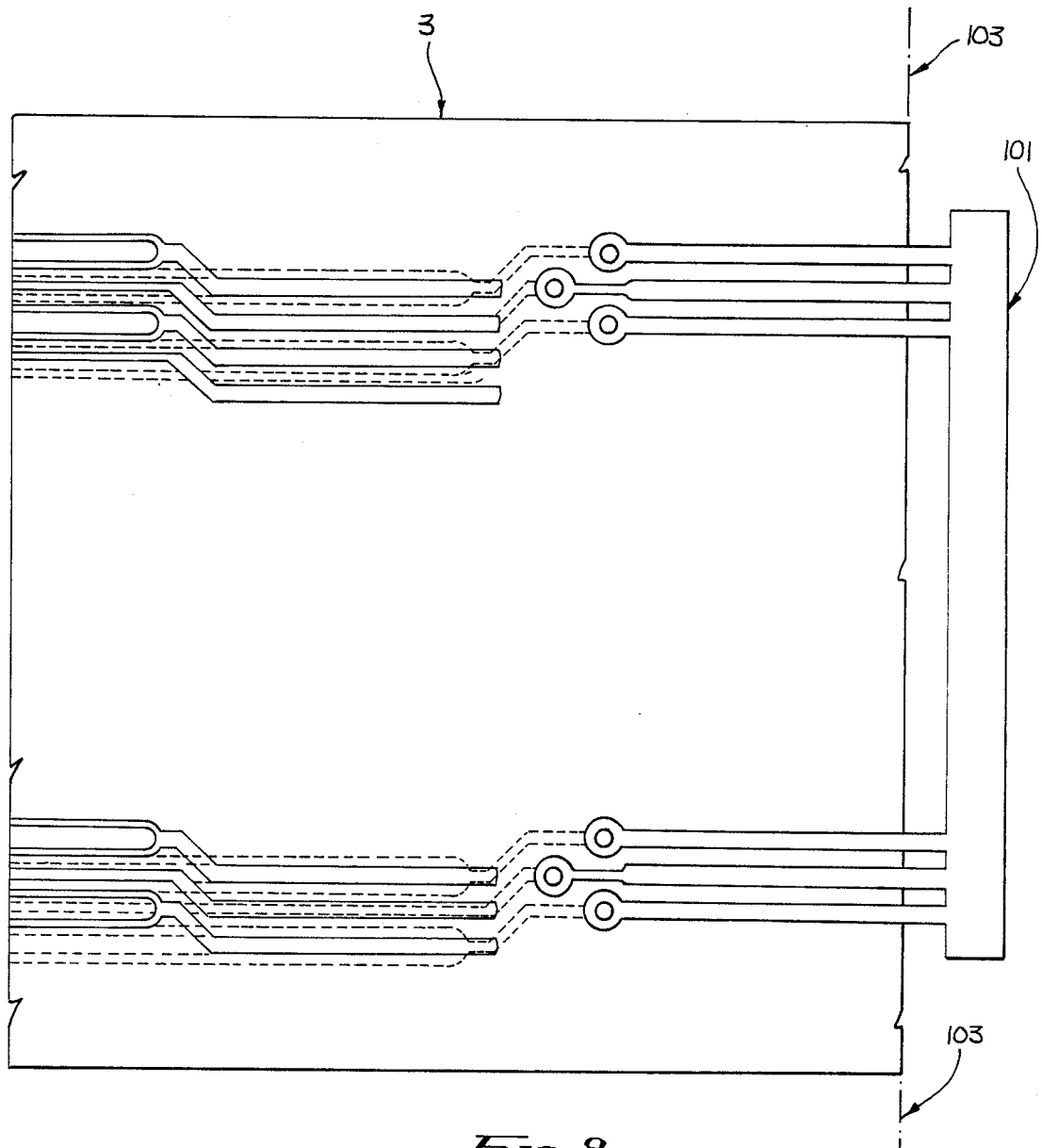
FIG. 8 is a top view of a flexible circuit with a gold plating bar in place during the plating process.

The connection pads 31 are plated in a post-etching process in order to avoid exposed copper along the edges of the connection pads. Using a plating bar 101 as illustrated in FIG. 8 low stress nickel is electrolytically deposited on the copper leads. The nickel is 0.00015 inches thick, minimum and is deposited in accordance with Federal Specification QQ-N-290A.

Gold plating is then electrolytically deposited in accordance with MIL-G-45204, grade A, type 1 with a thickness of 0.000050 inches minimum. The plating bar 101 is then sheared off at line 103 to achieve the finished cable. The post-etching method for the nickel and gold plating avoids exposed copper along the edges of the connection pads.

Referring now to FIG. 4, the rigid PC board 7 is illustrated. The rigid PC board 7 of the preferred embodiment is rectangular in shape. As stated above, the connection pads 71 are electrically coupled through the MOE strip to the connection pads of the high density flexible circuit. Again, holes for the screw fasteners 72 and holes for the alignment posts 73 are provided on both outer edges of the high density flexible circuit. The connection pads 71 are plated with nickel and gold in the same post-etching process as used for the flexible circuit, except the gold fingers are a minimum of 0.000030 inches thick.

Figure 5A:
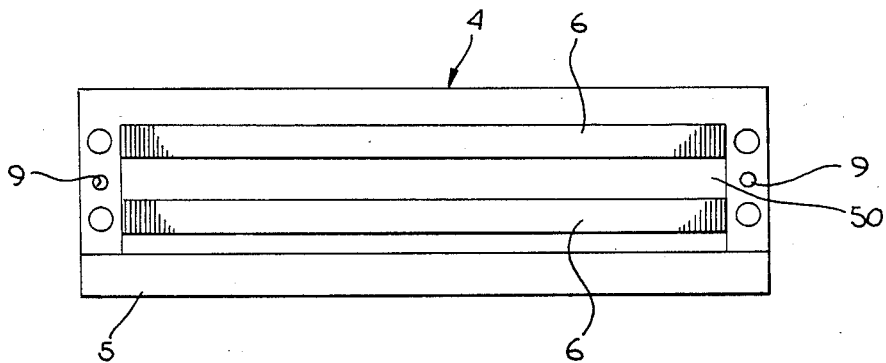
FIG. 5($a$) is a top view of a MOE holder used the hold the MOE strip of the present invention.
Figure 5B:
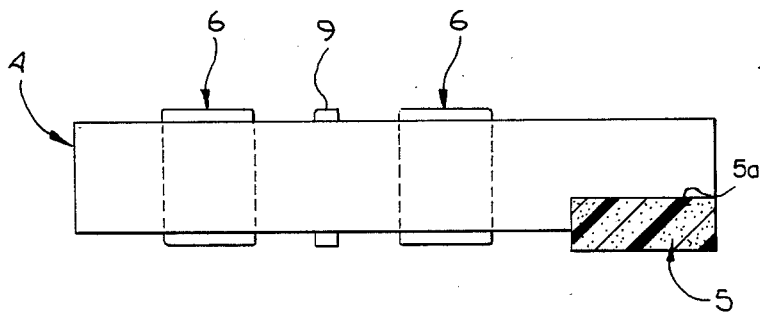
Figure 7:
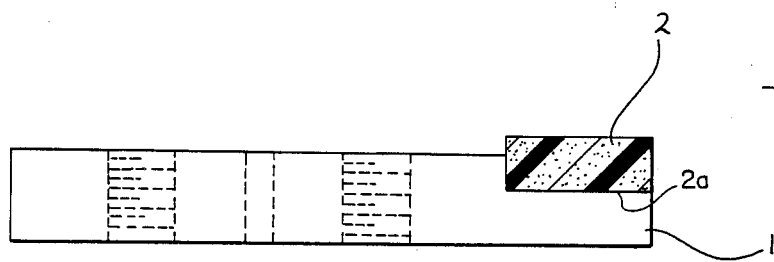
FIG. 7 is a side planar view of a MOE clamp used in the clamp assembly.

FIG. 5(b) illustrates a side planar view of the MOE holder 4 which shows several features of the present invention. The MOE holder 4 of the preferred embodiment is generally rectangular in shape with cut outs to accommodate the MOE strips 6. A soft mouth 5 is provided on both the MOE holder 4 and, as shown in FIG. 7, on the MOE clamp 1. This soft mouth 5, which rests against both sides of the high density flexible circuit when the clamping system is assembled, alleviates stress on the high density flexible circuit. This prevents fracturing or breaking of the conductors on the high density flexible circuit. Additionally, the soft mouth 5 eliminates problems of cracking on the high density flexible circuit due to differential thermal expansion between the clamping components and the high density flexible circuit.

In FIG. 5(a) a top view of the MOE holder is illustrated. This drawing illustrates a recessed area 50 which additionally relieves clamp pressure from the flexible circuit. This contributes further to eliminating problems of cracking on the flexible circuit.

In the preferred embodiment, the soft mouth 5 is constructed of a 1/16 inch thick Poron TM strip, part number 4716-16-20062-1633, manufactured by Rogers Corp., Industrial Materials Group, Poron Division, of East Woodstock, Conn. It will be obvious to one skilled in the art that other materials may perform the same function.

Again referring to FIG. 5(b), the MOE strips 6 are inserted into the MOE holder 4 in the openings molded for them. When inserted, the MOE strips 6 protrude slightly beyond the edges of MOE holder 4 on both sides. This feature allows for the necessary compression of the MOE strip 6 when the clamping system is assembled and fastened. The compression aids in stabilization of electrical resistance across the connector by preventing movement of the MOE strip 6. Alternative embodiments from the one illustrated can easily be envisioned which would accommodate MOE strips of differing sizes.

Finally, FIG. 5(b) illustrates the aligning post 9 which is used to align and stabilize the assembly and which was discussed above. The MOE holder in the preferred embodiment has dimensions of 2.225±0.020 by 0.700±0.020 by 0.115±0.002 inches. The opening for the MOE strips in the preferred embodiment are 1.825±0.005 by 0.100±0.002 inches. A slot 5a is cut 0.030 inches deep to accommodate the soft mouth 5. The MOE holder 4 is constructed of 30% glass filled polycarbonate. The MOE clamp of FIG. 7 has the same dimensions as the MOE holder however, it lacks the strip openings. In the present invention, one embodiment has the MOE clamp constructed of 0.125 inch thick aluminum in accordance with American Society of Testing Materials Specification A-384 (ASTM-SC114A) with a slot 2a cut for the soft mouth material 2. In another embodiment, the MOE clamp is constructed of 0.093 inch thick flat ground tool steel with a slot 2a 2 cut for the soft mouth material 2. Again, the specification presented is not meant to be limiting but is presented by way of example and it will be obvious to one skilled in the art that alternatives may be found.

Figure 6:
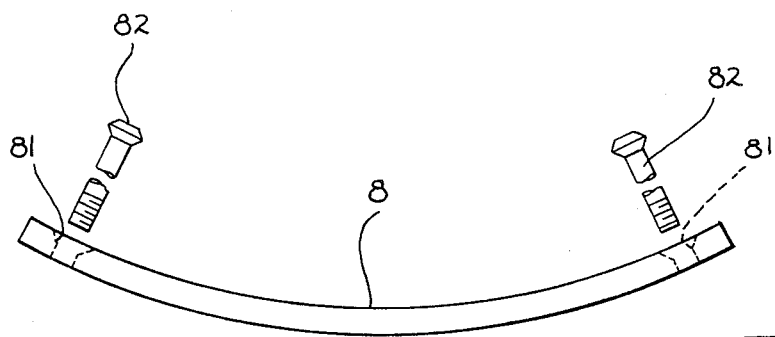
FIG. 6 is a side planar view of a stiffener used in the clamp assembly.

In FIG. 6 a side planar view of the stiffener 8 is illustrated. The stiffener 8 is designed to keep the rigid PC board flat which produces optimum compression of the MOE strip. This contributes further to the stability of the electrical resistance across the connector. The screws 82 are inserted through the screw holes 81 and the screw holes in the rest of the components and fastened to the MOE clamp as discussed above. The stiffener 8 in one embodiment of the present invention consists of a piece of rectangular hardened cold rolled annealed spring steel 0.055 inches thick. Dimensions for the stiffener 8 are 2.225±0.020 inches by 0.700±0.020 inches when flat. After the stiffener 8 is rolled the outer edges have a 0.030 inch rise from the center. Alternatively, another embodiment has the stiffener 8 made of aluminum in accordance with A-384 (ASTM-SC114A) being 0.110 inches thick and without any bend.

The present invention offers a number of advantages when compared with the prior art. The invention allows more than twice as many lines to be connected from a flexible circuit to a rigid PC board in a given board area as the prior art pin and socket technology. The ability to use a high density flexible circuit to connect to a rigid PC board allows use of a cable which has desirable electrical characteristics, yet is light and flexible. In addition, the space used for this termination is much less than conventional pin and socket connectors allowing use of small, low-profile, rigid PC boards.

Thus, a high density flexible circuit clamping system has been described. Utilizing a MOE strip and clamping components a high density flexible circuit may be attached to a rigid PC board.

I claim:

1. A connector for connecting electrical components comprising:
   a first electrical means with exposed conductive pads;
   a second electrical means with exposed conductive pads;
   a strip of compressible material with a plurality of electrical conductors wound around it placed between said first electrical means and said second electrical means for coupling said exposed conductive pads of both said electrical means together;
   a clamp to be placed on said first electrical means for providing rigidity and compression to said compressible material;
   fastening means for fastening said first electrical means, said electrical means, said compressible means, and said clamp together;
   a first flexible material and a second flexible material surrounding said first electrical means for alleviating stress on said first electrical means;
   whereby electrical contact is maintained between said first electrical means and said second electrical means.

2. The connector defined by claim 1 further comprising a holding means coupled to said first electrical means and said second electrical means, for holding said compressible material.

3. The connector defined by claim 1 further including a stiffener means coupled to said second electrical means for providing further rigidity and compression.

4. The connector defined by claim 1 wherein said fastening means is comprised of a plurality of screws and said first electrical means, second electrical means, said holding means and said clamp each have a plurality of holes for accepting said screws.

5. The connector defined by claim 4 wherein said holding means has a plurality of posts; and said first electrical means, second electrical means and said clamps each have a plurality of post holes for purposes of aligning elements with each other.

6. The connector defined by claim 5 further including a stiffener means coupled to said second electrical means for providing further rigidity and compression.

7. A connector for connecting electrical components comprising:
   a flexible circuit with exposed conductive pads;
   a circuit board with exposed conductive pads;
   a unitary strip of compressible material wrapped with a plurality of electrical conductors placed between said flexible circuit and said circuit board for coupling said exposed conductive pads on said flexible circuit and said exposed conductive pads on said circuit board through said plurality of electrical conductors;
   a clamp coupled with said flexible circuit for providing rigidity and compression to said compressible material;
   fastening means for fastening said flexible circuit, said circuit board, said compressible material and said clamp together;
   holding means for holding said compressible material, said holding means normally displaced between said flexible circuit and said circuit board;
   first flexible material coupled to said holding means and second flexible material coupled to said clamp, said first flexible material and said second flexible material surrounding said flexible circuit for alleviating stress on said flexible circuit;
   whereby electrical contact is maintained between said flexible circuit and said circuit board.

8. The connector defined by claim 7 further comprising a stiffener means coupled to said circuit board for providing further rigidity and compression.

9. The connector defined by claim 7 wherein said fastening means consists of a plurality of screws and said flexible circuit, said circuit board, said compressible material, said holding means and said clamp each have a plurality of screw holes for accepting said screws.

10. The connector defined by claim 9 wherein said holding means has a plurality of posts and said flexible circuit, said circuit board and said clamp each have a plurality of post holes for purposes of aligning elements with each other.

11. The connector defined by claim 10 further comprising a stiffener means coupled to said circuit board for providing further rigidity and compression.

12. A clamping system for connecting electrical components comprising:
   a flexible circuit having a strip of material with a plurality of copper electrical leads and having a strain relief at either end, said strain reliefs having a plurality of exposed gold and nickel plated conductive pads electrically coupled to said electrical leads;
   a rigid printed circuit board, rectangular in shape, with exposed gold and nickel plated conductive pads;
   a plurality of rectangular shaped strips made of a compressible material;
   said strips being wrapped with a plurality of gold and nickel plated copper electrical conductors;

said wrapped strips electrically coupled with said exposed conductive pads of said flexible circuit and said exposed conductive pads of said rigid printed circuit board such that said exposed conductive pads of said flexible circuit are electrically coupled with said exposed conductive pads of said rigid printed circuit board;

a clamp, a rectangular in shape and made of flat ground steel, coupled with said flexible circuit for providing rigidity and compression to said wrapped strips;

fastening means for fastening said flexible circuit, said rigid printed circuit board, said wrapped strips, and said clamp together;

whereby electrical coupling is maintained between said flexible circuit and said rigid printed circuit board.

13. The clamping system defined by claim 12 further comprising a stiffener means, comprised of a rectangular piece of slightly curved steel, coupled to said rigid printed circuit board with said fastening means for providing further rigidity and compression.

14. The clamping system defined by claim 12 further comprising a stiffener means, comprised of a rectangular piece of material to provide added rigidity to said rigid printed circuit board; said rectangular piece of material being made of a hard substance such as steel, aluminum or plastic.

15. The clamping system defined by claim 12 wherein said compressible material is a silicone elastomer substance.

16. The clamping system defined by claim 12 further comprising a holding means coupled to said flexible circuit and said rigid printed circuit board for holding said wrapped strips; said holding means being slightly thinner than said wrapped strips and having holes cut slightly longer and wider than said wrapped strips for purposes of containing said wrapped strips.

17. The clamping system defined by claim 16 further comprising a first flexible material coupled to said holding means and a second flexible material coupled to said clamp; said first flexible material and said second flexible material surrounding said flexible circuit for alleviating stress on said flexible circuit.

18. The clamping system defined by claim 17 wherein said fastening means consists of a plurality of screws and said flexible circuit, said rigid printed circuit board, said wrapped strips, said holding means and said clamp each have a plurality of holes for accepting said screws.

19. The clamping system defined by claim 18 wherein said holding means has a plurality of posts and said flexible circuit, said rigid printed circuit board and said clamp each have a plurality of post holes for purposes of aligning elements with each other.

20. The clamping system defined by claim 19 further comprising a stiffener means comprised of a rectangular piece of metal, coupled to said rigid printed circuit board with said fastening means for providing further rigidity and compression.

21. The clamping system defined by claim 20 wherein said holding means is made of a glass filled polycarbonate substance.

* * * * *

UNITED STATES PATENT AND TRADEMARK OFFICE
CERTIFICATE OF CORRECTION

PATENT NO. : 4,850,883
DATED : 7/25/89
INVENTOR(S) : Kabadi

It is certified that error in the above-identified patent and that said Letters Patent is hereby corrected as shown below:

| | | |
|---|---|---|
| col. 02, line 28 | after "boards" | insert --is-- |
| col. 04, line 68 | after "2a" | delete "2" |
| col. 05, line 51 | before "electrical" | insert --second-- |
| col. 05, line 52 | delete "means" | insert --material-- |
| col. 07, line 08 | after "clamp," | delete "a" |

Signed and Sealed this

Fourth Day of June, 1991

Attest:

HARRY F. MANBECK, JR.

Attesting Officer

Commissioner of Patents and Trademarks